United States Patent
Na

(10) Patent No.: US 8,390,350 B2
(45) Date of Patent: Mar. 5, 2013

(54) CLOCK SIGNAL DELAY CIRCUIT FOR A LOCKED LOOP CIRCUIT

(75) Inventor: Kwang Jin Na, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 150 days.

(21) Appl. No.: 12/845,416

(22) Filed: Jul. 28, 2010

(65) Prior Publication Data

US 2011/0234280 A1 Sep. 29, 2011

(30) Foreign Application Priority Data

Mar. 29, 2010 (KR) .................. 10-2010-0027819

(51) Int. Cl.
*H03L 7/06* (2006.01)
(52) U.S. Cl. .................... 327/158; 327/156; 375/376
(58) Field of Classification Search .................. 327/158, 327/149, 156, 147; 375/373, 376
See application file for complete search history.

(56) References Cited

U.S. PATENT DOCUMENTS

| | | | |
|---|---|---|---|
| 6,943,602 | B1 | 9/2005 | Lee |
| 6,985,401 | B2 | 1/2006 | Jang et al. |
| 6,987,408 | B2 | 1/2006 | Kim |
| 6,995,591 | B2 | 2/2006 | Lee |
| 7,103,133 | B2 | 9/2006 | Jung |
| 2005/0195663 | A1 | 9/2005 | Kwak |
| 2007/0012654 | A1* | 1/2007 | Kim et al. ................ 216/2 |
| 2009/0091363 | A1* | 4/2009 | Kang et al. ............. 327/158 |
| 2009/0206884 | A1* | 8/2009 | Shin ............................ 327/2 |
| 2010/0060335 | A1* | 3/2010 | Kwak et al. ............. 327/158 |
| 2010/0213995 | A1* | 8/2010 | Lee ........................... 327/158 |
| 2011/0012654 | A1* | 1/2011 | Shin et al. ................ 327/158 |
| 2011/0043263 | A1* | 2/2011 | Kim .......................... 327/158 |
| 2011/0316598 | A1* | 12/2011 | Petrie ........................ 327/158 |

FOREIGN PATENT DOCUMENTS

| | | |
|---|---|---|
| JP | 2003-045183 | 2/2003 |
| JP | 2004-104747 | 4/2004 |
| JP | 2005-251368 | 9/2005 |
| JP | 2005-332548 | 12/2005 |
| KR | 1020060083575 A | 7/2006 |

* cited by examiner

*Primary Examiner* — Ryan Jager
(74) *Attorney, Agent, or Firm* — William Park & Associates Ltd.

(57) ABSTRACT

A clock signal delay circuit includes a variable delay unit, a delay unit, a phase detection block, a control clock output block, and a delay control unit. The variable delay unit controls a delay amount of a reference clock signal based on a delay control signal and provides a delayed clock signal based thereon. The delay unit delays the delayed clock signal and provides a feedback clock signal based thereon. The phase detection block detects a phase difference between the feedback clock signal and the reference clock signal and provides a detected phase difference based thereon. The control clock output block provides a control clock signal based on the detected phase difference. The delay control unit generates the delay control signal based on the detected phase difference and in response to the control clock signal.

12 Claims, 6 Drawing Sheets

CLOCK SIGNAL DELAY CIRCUIT FOR A LOCKED LOOP CIRCUIT

CROSS-REFERENCES TO RELATED APPLICATION

The present application claims priority under 35 U.S.C. §119(a) to Korean application No. 10-2010-0027819, filed on Mar. 29, 2010, in the Korean Intellectual Property Office, which is incorporated herein by reference in its entirety.

BACKGROUND

1. Technical Field

The present invention relates generally to a semiconductor apparatus, and more particularly to a technology for configuring a clock signal delay circuit.

2. Related Art

A semiconductor apparatus operates in synchronization with a periodic reference pulse signal such as a clock so as to improve an operation speed and ensure efficient internal operations. Accordingly, most semiconductor apparatuses operate using a clock supplied from an outside clock or from an internal clock generated therein as the occasion demands.

Since an external clock signal input to a semiconductor apparatus is delayed in the semiconductor apparatus, when data is output using the delayed clock signal, a problem is caused such that the output data is not synchronized with the external clock signal. Therefore, the semiconductor apparatus compensates for the phase difference between the external clock signal and the internal clock signal by using a delay locked loop (DLL) or a phase locked loop (PLL).

However, even when the phase difference between the external clock signal and the internal clock signal is compensated for by using a clock delay circuit such as the delay locked loop (DLL), a phase difference may occur due to introduction of power noise, etc. Thus, a technology capable of quickly compensating for such a phase difference is demanded in the art.

SUMMARY

In one embodiment of the present invention, a clock signal delay circuit includes: a variable delay unit configured to control a delay amount of a reference clock signal under the control of a delay control signal and output a delayed clock signal; a delay unit configured to delay the delayed clock signal outputted from the variable delay unit; a phase detection block configured to detect a phase difference between a feedback clock signal outputted from the delay unit and the reference clock signal; a control clock output block configured to output a control clock signal which is controlled in a toggling cycle thereof depending upon a detection result of the phase detection unit; and a delay control unit configured to generate the delay control signal corresponding to the detection result of the phase detection unit in response to the control clock signal.

In another embodiment of the present invention, a clock signal delay circuit includes: a variable delay unit configured to control a delay amount of an input clock signal under the control of a delay control signal and output a delayed clock signal; a first phase detection unit configured to output a first phase detection signal which has a value corresponding to a phase difference between the input clock signal and a reference clock signal; a control clock output block configured to compare phases of the input clock signal and the reference clock signal and output a control clock signal which is controlled in a toggling cycle thereof; and a delay control unit configured to generate the delay control signal corresponding to the first phase detection signal in response to the control clock signal.

BRIEF DESCRIPTION OF THE DRAWINGS

Features, aspects, and embodiments are described in conjunction with the attached drawings, in which.

DETAILED DESCRIPTION

Figure 1:
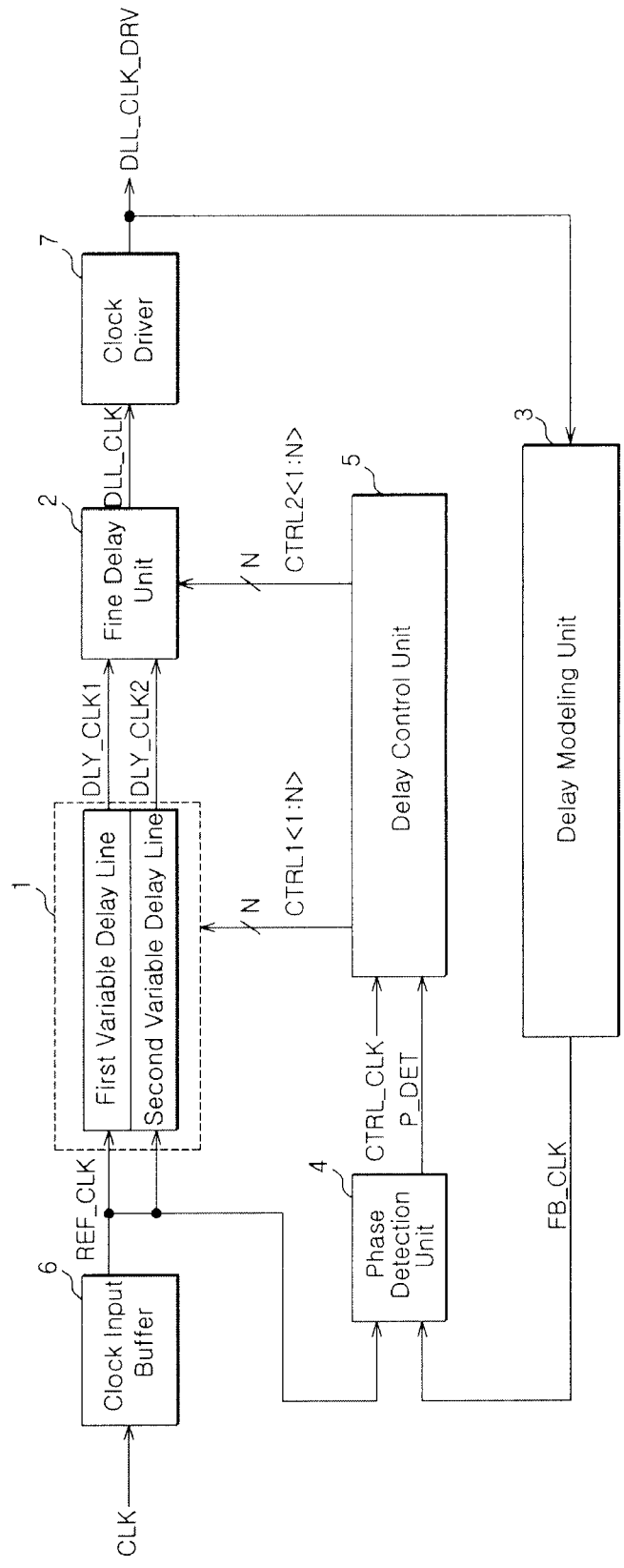
FIG. 1 is an example diagram of a delay locked loop (DLL) in accordance with a first embodiment of the present invention.

Hereinafter, a clock signal delay circuit according to an embodiment of the present invention will be described below with reference to the accompanying drawings through specific embodiments. Terms, symbols and signs that are used in the drawings and in this detailed description to designate devices, blocks, and so on may be used for detailed units as the occasion demands, however it is to be noted that the same terms, symbols and signs may not necessarily designate the same devices, blocks, and so on.

FIG. 1 is an example diagram of a locked loop (DLL) in accordance with a first embodiment of the present invention. The delay locked loop includes a clock input buffer 6, a variable delay unit 1, a fine delay unit 2, a clock driver 7, a delay modeling unit 3, a phase detection unit 4, and a delay control unit 5.

The configuration and operations of the delay locked loop configured as mentioned above are described below.

The clock input buffer 6 is configured to buffer an input clock signal CLK and to output a reference clock signal REF_CLK based theron.

The variable delay unit 1 is configured to control the delay amount of the reference clock signal REF_CLK based on a first delay control signal CTRL1<1:N>, and to output first and second delayed clock signals DLY_CLK1 and DLY_CLK2, respectively. The variable delay unit 1 includes a first variable delay line and a second variable delay line. The first variable delay line is configured to control the delay amount of the reference clock signal REF_CLK based on the first delay control signal CTRL1<1:N>, and to output the first delayed clock signal DLY_CLK1 based thereon. The second variable delay line is configured to control the delay amount of the reference clock signal REF_CLK based on the first delay control signal CTRL1<1:N>, and to output the second delayed clock signal DLY_CLK2 based thereon. The first delayed clock signal DLY_CLK1 and the second delayed clock signal DLY_CLK2 can be generated to have a predetermined phase difference.

The fine delay unit 2 is configured to control the delay amounts of the first and second delayed clock signals DLY- _CLK1 and DLY_CLK2 from the variable delay unit 1 based on a second delay control signal CTRL2<1:N>, and to output a DLL clock signal DLL_CLK. The fine delay unit 2 can include a phase mixer. The fine delay unit 2 mixes phases of the first delayed clock signal DLY_CLK1 and the second delayed clock signal DLY_CLK2 based on the second delay control signal CTRL2<1:N>, and generates the DLL clock signal DLL_CLK based thereon. That is to say, since the first delayed clock signal DLY_CLK1 and the second delayed clock signal DLY_CLK2 provided from the variable delay unit 1 are generated to have the predetermined phase difference, the fine delay unit 2 controls phase weights of the first delayed clock signal DLY_CLK1 and the second delayed clock signal DLY_CLK2 based on the second delay control signal CTRL2<1:N>. As such, the variable delay unit 1 functions to control a delay amount over a wide range, and the fine delay unit 2 functions to finely control the delay amounts of signals from the variable delay unit 1 within a narrow range.

The clock driver 7 is configured to drive the DLL clock signal DLL_CLK output from the fine delay unit 2.

The delay modeling unit 3 is configured to delay a DLL clock signal DLL_CLK_DRV output from the clock driver 7 by a model delay amount of a clock transfer path. The model delay amount can be obtained by modeling delay amounts of the clock input buffer 6, the clock driver 7 and the transmission line of the DLL clock signal DLL_CLK_DRV of the clock transfer path.

The phase detection unit 4 is configured to detect a phase difference between a feedback clock signal FB_CLK output from the delay modeling unit 3 and the reference clock signal REF_CLK. A phase detection signal P_DET is output from the phase detection unit 4. The phase detection signal P_DET can be a signal that has a voltage level corresponding to the phase difference between the feedback clock signal FB_CLK and the reference clock signal REF_CLK. Alternatively, or in addition to, the phase detection signal P_DET can be a signal that has a pulse width corresponding to the phase difference between the feedback clock signal FB_CLK and the reference clock signal REF_CLK. Further, the phase detection signal P_DET can be a multi-bit code value. The phase control unit 5 generates the first delay control signal CTRL1<1:N> and the second delay control signal CTRL2<1:N> based on the phase detection signal P_DET.

The delay control unit 5 is configured to generate the first delay control signal CTRL1<1:N> and the second delay control signal CTRL2<1:N> in response to a control clock signal CTRL_CLK. The first delay control signal CTRL1<1:N> is used to control the delay amount in the variable delay unit 1, and the second delay control signal CTRL2<1:N> is used to control the delay amounts in the fine delay unit 2. The delay control unit 5 can include a shift register, or the like. The control clock signal CTRL_CLK can be a signal that is generated by dividing the reference clock signal REF_CLK.

Summarizing the operations of the above-described delay locked loop (DLL), if a phase difference occurs between the feedback clock signal FB_CLK and the reference clock signal REF_CLK, the first delay control signal CTRL1<1:N> and the second delay control signal CTRL2<1:N> are updated based on the control clock signal CTRL_CLK. Thereafter, an operation for locking the DLL clock signal DLL_CLK can be performed. The control clock signal CTRL_CLK can be a clock signal generated by dividing the reference clock signal REF_CLK toggles with a cycle that is locked in consideration of update efficiency, etc.

Figure 2:
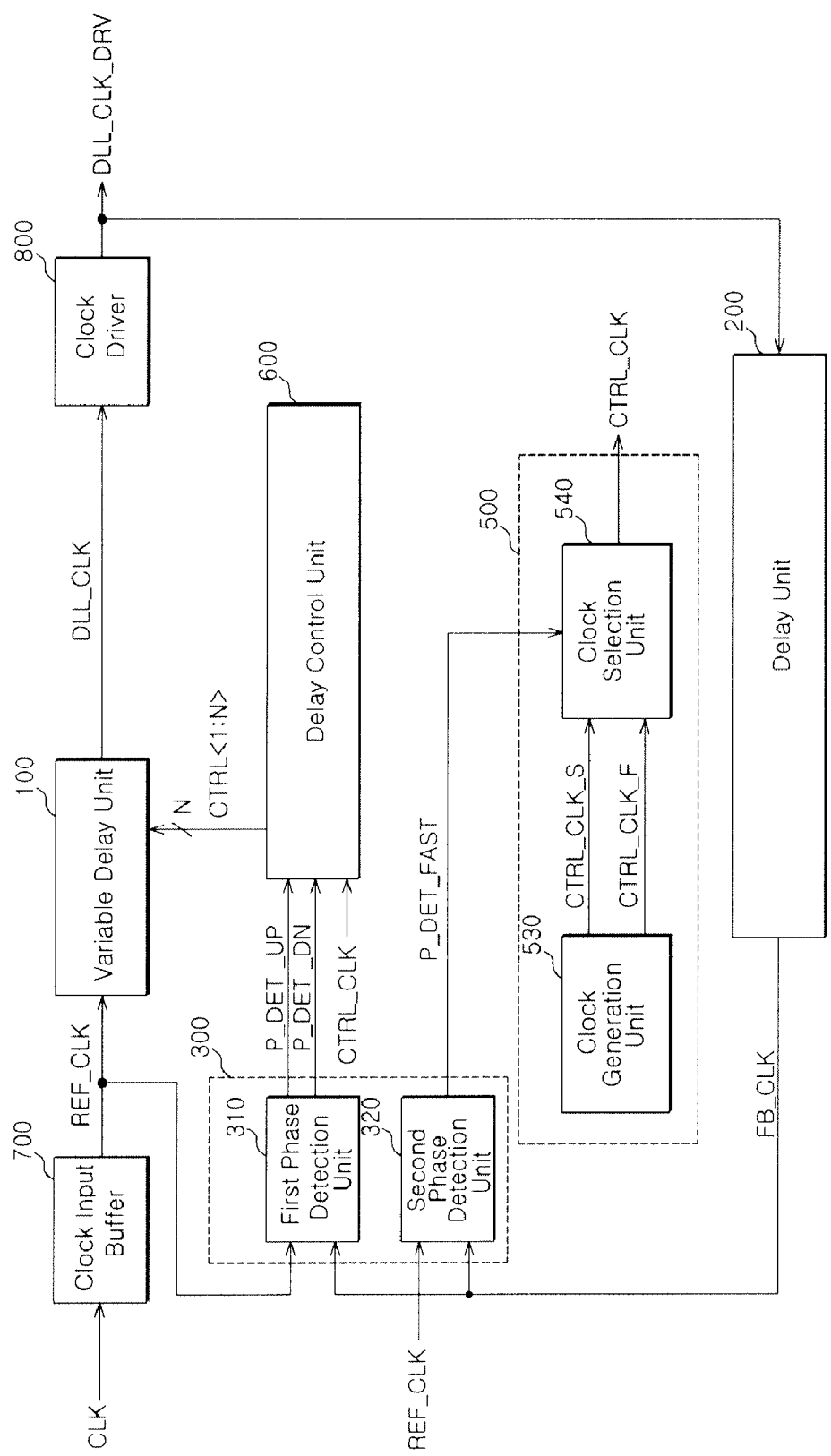
FIG. 2 is an example diagram of a clock signal delay circuit in accordance with a second embodiment of the present invention.

FIG. 2 is an example diagram of a clock signal delay circuit in accordance with a second embodiment of the present invention. The clock signal delay circuit includes a variable delay unit 100, a delay unit 200, a phase detection block 300, a control clock output block 500, and a delay control unit 600.

The clock signal delay circuit can further include a clock input buffer 700 and a clock driver 800. The clock input buffer 700 is configured to buffer an input clock signal CLK and to output a reference clock signal REF_CLK based thereon. The clock driver 800 is configured to drive a delayed clock signal DLL_CLK output from the variable delay unit 100.

The configuration and operations of the clock signal delay circuit configured as mentioned above are described below.

The clock input buffer 700 buffers the input clock signal CLK and outputs the reference clock signal REF_CLK based thereon.

The variable delay unit 100 is configured to control a delay amount of the reference clock signal REF_CLK based on a delay control signal CTRL<1:N>, and to output the delayed clock signal DLL_CLK. The variable delay unit 100 can include a variable delay line, or the like.

As noted above, the clock driver 800 drives the delayed clock signal DLL_CLK output form the variable delay unit 100.

The delay unit 200 is configured to delay a delayed clock signal DLL_CLK_DRV output from the clock driver 800 by a model delay amount of a clock transfer path. The model delay amount can be obtained by modeling delay amounts of the clock input buffer 700, the clock driver 800 and the transmission line of the delayed clock signal DLL_CLK_DRV of the clock transfer path.

The phase detection block 300 is configured to detect a phase difference between a feedback clock signal FB_CLK output from the delay unit 200 and the reference clock signal REF_CLK. The phase detection block 300 includes a first phase detection unit 310 and a second phase detection unit 320. The first phase detection unit 310 is configured to detect whether the phase difference between the feedback clock signal FB_CLK and the reference clock signal REF_CLK is within a first difference value. The second phase detection unit 320 is configured to detect whether the phase difference between the feedback clock signal FB_CLK and the reference clock signal REF_CLK within a second difference value. The first phase detection unit 310 outputs first phase detection signals P_DET_UP and P_DET_DN, respectively, which have values corresponding to the phase differences between the feedback clock signal FB_CLK and the reference clock signal REF_CLK. The second phase detection unit 320 outputs a second phase detection signal P_DET_FAST which is selectively activated depending upon the phase difference between the feedback clock signal FB_CLK and the reference clock signal REF_CLK.

Figure 3:
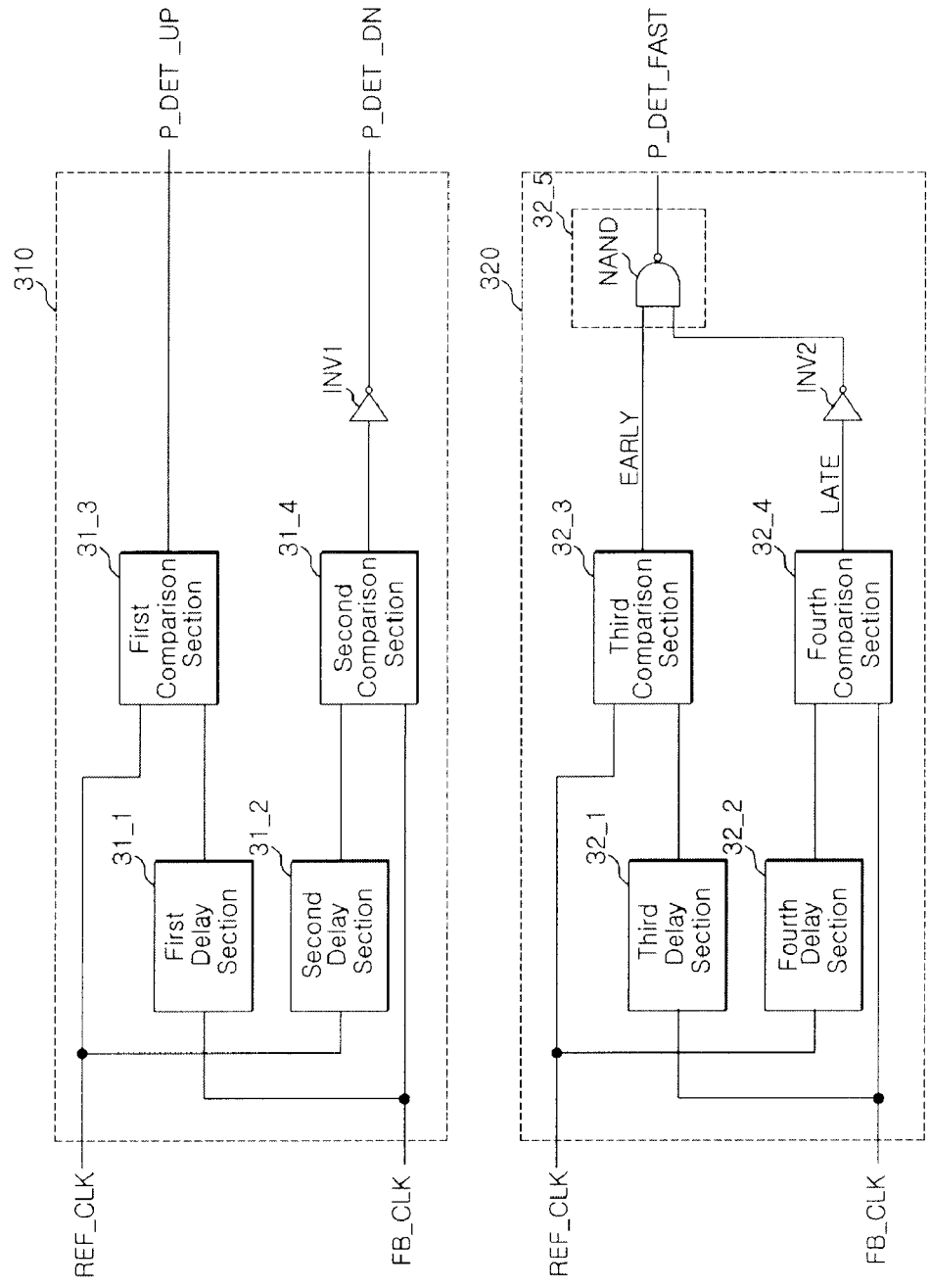
FIG. 3 is an example diagram of an example embodiment of a phase detection block shown in FIG. 2.

FIG. 3 is an example circuit diagram of the phase detection block 300 shown in FIG. 2. The first phase detection unit 310 includes a first delay section 31_1, a second delay section 31_2, a first comparison section 31_3, and a second comparison section 31_4. The first delay section 31_1 delays the feedback clock signal FB_CLK by the first difference value. The second delay section 31_2 delays the reference clock signal REF_CLK by the first difference value. The first comparison section 31_3 compares the reference clock signal REF_CLK and a first delayed clock signal outputfrom the first delay section 31_1, and outputs a first comparison result as the first phase detection signal P_DET_UP. The second comparison section 31_4 compares the feedback clock signal FB_CLK and a second delayed clock signal output from the second delay section 31_2, and outputs a second comparison result as the first phase detection signal P_DET_DN. The first phase detection signals P_DET_UP and P_DET_DN, which are output from the first comparison section 31_3 and the second comparison section 31_4, respectively, are signals having values based on whether the phase difference between the reference clock signal REF_CLK and the feedback clock signal FB_CLK is within the first difference value or not. In this example, the delay values of the first delay section 31_1 and the second delay section 31_2 are substantially the same, however other delay values are contemplated.

The second phase detection unit 320 includes a third delay section 32_1, a fourth delay section 32_2, a third comparison section 32_3, a fourth comparison section 32_4, and a signal combining section 32_5. The third delay section 32_1 delays the feedback clock signal FB_CLK by the second difference value. The fourth delay section 32_2 delays the reference clock signal REF_CLK by the second difference value. The third comparison section 32_3 compares the reference clock signal REF_CLK and the clock signal output from the third delay section 32_1. The fourth comparison section 32_4 compares the feedback clock signal FB_CLK and the clock signal output from the fourth delay section 32_2. The signal combining section 32_5 combines (e.g., logically) signals EARLY and LATE which are output from the third and fourth comparison sections 32_3 and 32_4, respectively, and outputs the second phase detection signal P_DET_FAST based thereon. The signal combining section 32_5 includes a NAND gate. The second phase detection signal P_DET_FAST which is output from the signal combining section 32_5, is a signal that is selectively activated based on whether the phase difference between the reference clock signal REF_CLK and the feedback clock signal FB_CLK is within the second difference value or not. In this example, the delay values of the third delay section 32_1 and the fourth delay section 32_2 are substantially the same, however other delay values are contemplated.

Figure 4:
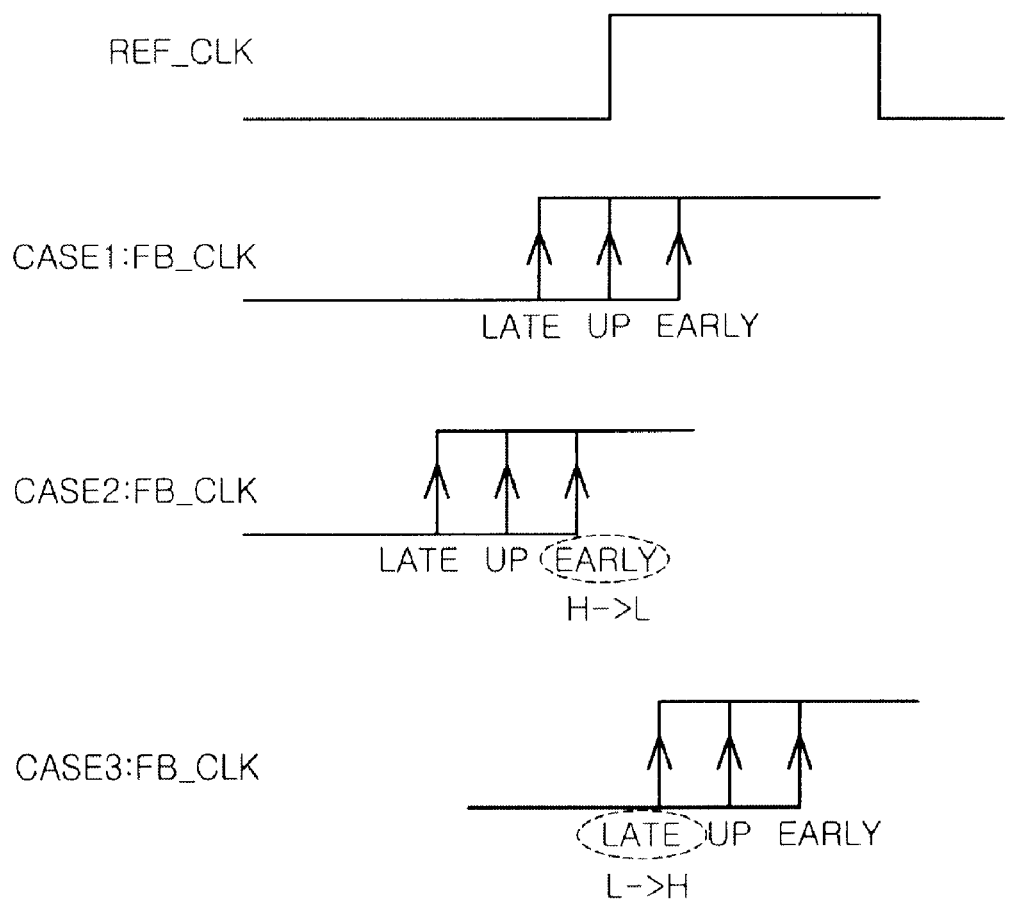
FIG. 4 is an example timing diagram depicting operations of a second phase detection unit shown in FIG. 3.

FIG. 4 is an example timing diagram depicting operations of the second phase detection unit 320. The operations of the second phase detection unit 320 are described below with reference to FIGS. 2, 3, and 4.

With regard to CASE1, as shown signals EARLY and LATE, which are output from the third and fourth comparison sections 32_3 and 32_4, respectively, are not activated. (Assuming the phase difference between the reference clock signal REF_CLK and the feedback clock signal FB_CLK is within the second difference value.) Accordingly, the second phase detection signal P_DET_FAST from the signal combining section 32_5 is deactivated to a low level.

CASE2 represents a case where the phase of the feedback clock signal FB_CLK is earlier than the delay value in the third delay section 32_1 when compared to the phase of the reference clock signal REF_CLK. (Assuming that the phase difference between the reference clock signal REF_CLK and the feedback clock signal FB_CLK is larger than the second difference value.) At this time, since the signal EARLY from the third comparison section 32_3 is activated to a low level, the second phase detection signal P_DET_FAST from the signal combining section 32_5 is activated to a high level.

CASE3 represents a case where the phase of the feedback clock signal FB_CLK is later than the delay value in the fourth delay section 32_2 when compared to the phase of the reference clock signal REF_CLK. (Assuming that the phase difference between the reference clock signal REF_CLK and the feedback clock signal FB_CLK is larger than the second difference value.) At this time, since the signal LATE from the fourth comparison section 32_4 is activated to a high level, the second phase detection signal P_DET_FAST from the signal combining section 32_5 is activated to a high level.

The first phase detection signals P_DET_UP and P_DET_DN, which are output from the first phase detection unit 310, can be signals that have voltage levels corresponding to the phase differences between the feedback clock signal FB_CLK and the reference clock signal REF_CLK. Alternatively, or in addition to, the first phase detection signals P_DET_UP and P_DET_DN can be signals that have pulse widths corresponding to the phase differences between the feedback clock signal FB_CLK and the reference clock signal REF_CLK. Further, the first phase detection signals P_DET_UP and P_DET_DN can be multi-bit code values. The first phase detection signals P_DET_UP and P_DET_DN are used to generate the delay control signal CTRL<1:N> in the delay control unit 600. The second phase detection signal P_DET_FAST is used as a signal to determine a toggling cycle of a control clock signal CTRL_CLK output from the control clock output block 500.

The control clock output block 500 is configured to output the control clock signal CTRL_CLK, which is controlled during the toggling cycle based on the detection result of the second phase detection unit 320. The control clock output block 500 outputs the control clock signal CTRL_CLK, which has a shorter toggling cycle as the phase difference between the feedback clock signal FB_CLK and the reference clock signal REF_CLK becomes larger. The control clock output block 500 includes a clock generation unit 530 and a clock selection unit 540. The clock generation unit 530 is configured to generate a first control clock signal CTRL_CLK_S and a second control clock signal CTRL_CLK_F, which has a toggling cycle shorter than the first control clock signal CTRL_CLK_S. The clock selection unit 540 is configured to selectively output the first control clock signal CTRL_CLK_S or the second control clock signal CTRL_CLK_F in response to the second phase detection signal P_DET_FAST. More specifically, the clock selection unit 540 outputs the control clock signal CTRL_CLK, which has a shorter toggling cycle when the second phase detection signal P_DET_FAST is activated. Therefore, operations are performed in such a manner that, as the phase difference between the feedback clock signal FB_CLK and the reference clock signal REF_CLK is larger, the control clock signal CTRL_CLK has a shorter toggling cycle. In one example, the control clock output block 500 can be configured using a clock dividing unit that is configured to divide the reference clock signal REF_CLK and to output the first control clock signal CTRL_CLK_S and the second control clock signal CTRL_CLK_F, which has a shorter toggling cycle than the first control clock signal CTRL_CLK_S.

The delay control unit 600 is configured to generate the delay control signal CTRL<1:N> corresponding to the detection result of the first phase detection unit 310 in response to the control clock signal CTRL_CLK. In other words, the delay control unit 600 outputs the delay control signal CTRL<1:N> corresponding to the first phase detection signals P_DET_UP and P_DET_DN based on the control clock signal CTRL_CLK. The delay control signal CTRL<1:N> is used to control the delay amount in the variable delay unit 100. The delay control unit 600 can include a shift register, or the like. Since the delay control signal CTRL<1:N> is a signal that is generated based on the control clock signal CTRL_CLK, an update cycle becomes shorter as the toggling cycle of the control clock signal CTRL_CLK becomes shorter. In this example, where the delay control unit 600 includes a shift register, updates of code output from the shift register is performed earlier as the toggling cycle of the control clock signal CTRL_CLK becomes shorter due to the control clock signal CTRL_CLK being used as the operating clock signal of the shift register.

Summarizing operations of the above-stated clock signal delay circuit, if the phase difference between the feedback clock signal FB_CLK and the reference clock signal REF_CLK is large, since the toggling cycle of the control clock signal CTRL_CLK becomes shorter, and the update of the delayed clock signal DLL_CLK is performed relatively earlier. If the phase difference between the feedback clock signal FB_CLK and the reference clock signal REF_CLK is small, the toggling cycle of the control clock signal CTRL_CLK becomes longer, and the update of the delayed clock signal CTRL_CLK is performed relatively later. By adopting such a method, in the case where a phase difference occurs between the feedback clock signal FB_CLK and the reference clock signal REF_CLK due to introduction of power noise, etc., an operation for compensating for the phase difference, that is, a clock recovery operation can be quickly performed. As the delayed clock signal DLL_CLK is generated in this manner, unnecessary current consumption can be suppressed, and update operations of the delayed clock signal DLL_CLK can be effectively performed.

Figure 5:
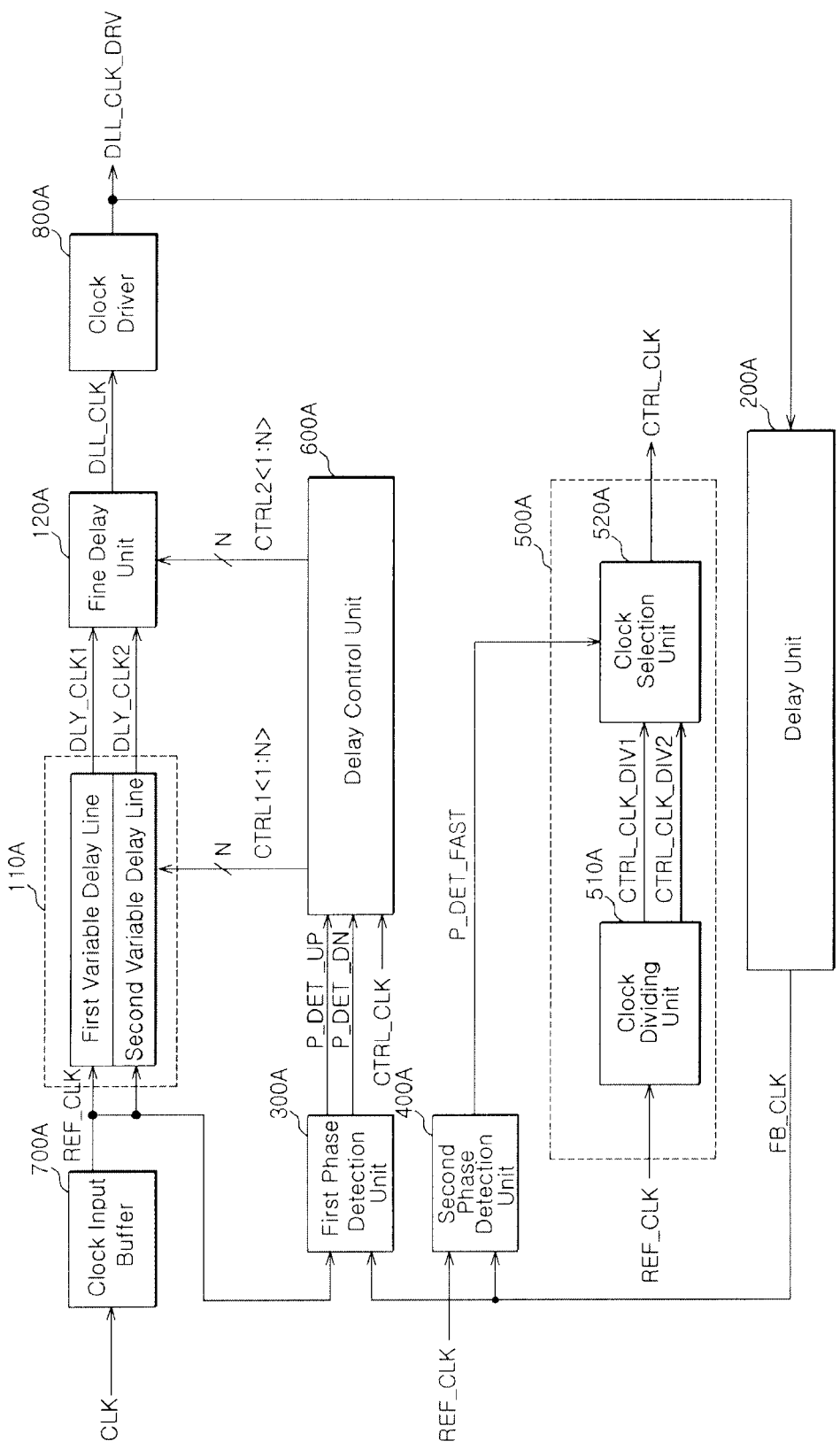
FIG. 5 is an example diagram of a clock signal delay circuit in accordance with a third embodiment of the present invention.

FIG. 5 is an example diagram of a clock signal delay circuit in accordance with a third embodiment of the present invention. The clock signal delay circuit includes a variable delay unit 110A, a fine delay unit 120A, a delay unit 200A, a first phase detection unit 300A, a second phase detection unit 400A, a control clock output block 500A, and a delay control unit 600A.

The clock signal delay circuit can also include a clock input buffer 700A and a clock driver 800A. The clock input buffer 700A is configured to buffer an input clock signal CLK and to output a reference clock signal REF_CLK based thereon. The clock driver 800A is configured to drive a second delayed clock signal DLL_CLK, which is output from the fine delay unit 120A.

The configuration and operations of the clock signal delay circuit configured as mentioned above are described below.

As noted above, the clock input buffer 700A buffers the input clock signal CLK and outputs the reference clock signal REF_CLK based thereon.

The variable delay unit 110A is configured to control a delay amount of the reference clock signal REF_CLK based on a first delay control signal CTRL1<1:N>, and to output first delayed clock signals DLY_CLK1 and DLY_CLK2. The variable delay unit 110A includes a first variable delay line and a second variable delay line. The first variable delay line is configured to control the delay amount of the reference clock signal REF_CLK based on the first delay control signal CTRL1<1:N>, and to output the first delayed clock signal DLY_CLK1. The second variable delay line is configured to control the delay amount of the reference clock signal REF_CLK based on the first delay control signal CTRL1<1:N>, and to output the first delayed clock signal DLY_CLK2. The first delayed clock signals DLY_CLK1 and DLY_CLK2, which are output from the first variable delay line and the second variable delay line, respectively, can be generated to have a predetermined phase difference.

The fine delay unit 120A is configured to control the delay amounts of the first delayed clock signals DLY_CLK1 and DLY_CLK2, output from the variable delay unit 110A, based on a second delay control signal CTRL2<1:N>, and to output the second delayed clock signal DLL_CLK.

The fine delay unit 120A can include a phase mixer. The fine delay unit 120A mixes phases of the first delayed clock signals DLY_CLK1 and DLY_CLK2 based on the second delay control signal CTRL2<1:N>, and generates the second delayed clock signal DLL_CLK based theron. That is to say, since the first delayed clock signals DLY_CLK1 and DLY_CLK2 provided from the variable delay unit 110A are generated to have the predetermined phase difference, the fine delay unit 120A controls phase weights of the multitude of first delayed clock signals DLY_CLK1 and DLY_CLK2 based on the second delay control signal CTRL2<1:N>. As such, the variable delay unit 110A functions to control a delay amount over a wide range, and the fine delay unit 120A functions to finely control the delay amounts of the signals output from the variable delay unit 110A within a narrow range.

As noted above, the clock driver 800A drives the second delayed clock signal DLL_CLK output from the fine delay unit 120A.

The delay unit 200A is configured to delay a second delayed clock signal DLL_CLK_DRV output from the clock driver 800A by a model delay amount of a clock transfer path. The model delay amount can be obtained by modeling the delay amounts of the clock input buffer 700A, the clock driver 800A and the transmission line of the second delayed clock signal DLL_CLK_DRV of the clock transfer path.

The first phase detection unit 300A is configured to output first phase detection signals P_DET_UP and P_DET_DN which have values corresponding to the phase differences between a feedback clock signal FB_CLK outputted from the delay unit 200A and the reference clock signal REF_CLK. The second phase detection unit 400A is configured to output a second phase detection signal P_DET_FAST, which is selectively activated based on the phase difference between the feedback clock signal FB_CLK and the reference clock signal REF_CLK. The first phase detection unit 300A and the second phase detection unit 400A can be configured as shown in FIG. 3.

The first phase detection signals P_DET_UP and P_DET_DN, which are outputted from the first phase detection unit 300A, can be signals that have voltage levels corresponding to phase differences between the feedback clock signal FB_CLK and the reference clock signal REF_CLK. Alternatively, or in addition to, the first phase detection signals P_DET_UP and P_DET_DN can be signals that have pulse widths corresponding to phase differences between the feedback clock signal FB_CLK and the reference clock signal REF_CLK. Further, the first phase detection signals P_DET_UP and P_DET_DN can multi-bit code values. The first phase detection signals P_DET_UP and P_DET_DN are used to generate the first delay control signal CTRL1<1:N> and the second delay control signals CTRL2<1:N> in the delay control unit 600A. The second phase detection signal P_DET_FAST is used to determine a toggling cycle of a control clock signal CTRL_CLK output from the control clock output block 500A.

The control clock output block 500A is configured to output the control clock signal CTRL_CLK, which has a toggling cycle based on the second phase detection signal P_DET_FAST. The control clock output block 500A outputs the control clock signal CTRL_CLK, which has a shorter toggling cycle as the phase difference between the feedback clock signal FB_CLK and the reference clock signal REF_CLK becomes larger.

The control clock output block 500A includes a clock dividing unit 510A and a clock selection unit 520A. The clock dividing unit 510A is configured to divide the reference clock signal REF_CLK and to output a first control clock signal CTRL_CLK_DIV1 and a second control clock signal CTRL_CLK_DIV2 which has a toggling cycle shorter than the first control clock signal CTRL_CLK_DIV1. The clock selection unit 520A is configured to selectively output the first control clock signal CTRL_CLK_DIV1 or the second control clock signal CTRL_CLK_DIV2 in response to the second phase detection signal P_DET_FAST. As such, the clock selection unit 520A outputs the control clock signal CTRL_CLK having a shorter toggling cycle when the second phase detection signal P_DET_FAST is activated. Accordingly, operations are performed in such a manner that, as the phase difference between the feedback clock signal FB_CLK and the reference clock signal REF_CLK is larger, the control clock signal CTRL_CLK has a shorter toggling cycle. In one example, the control clock output block 500A can be configured using a clock generation unit, including a ring oscillator, for generating multiple control clock signals having different toggling cycles.

The delay control unit 600A is configured to output the first delay control signal CTRL1<1:N> and the second delay control signal CTRL2<1:N> based on the first phase detection signals P_DET_UP and P_DET_DN and in response to the control clock signal CTRL_CLK. The delay control unit 600A can include a shift register, or the like. The first delay control signal CTRL1<1:N> is used to control the delay amount in the variable delay unit 110A, and the second delay control signal CTRL2<1:N> is used to control the delay amounts in the fine delay unit 120A. Since the first delay control signal CTRL1<1:N> and the second delay control signal CTRL2<1:N> are signals that are generated in response to the control clock signal CTRL_CLK, an update cycle becomes shorter as the toggling cycle of the control clock signal CTRL_CLK becomes shorter. In the example where the delay control unit 600A includes a shift register, updates of code output from the shift register is performed earlier as the toggling cycle of the control clock signal CTRL_CLK becomes shorter due to the control clock signal CTRL_CLK being used as the operating clock signal of the shift register.

In the above-described clock signal delay circuit, if the phase difference between the feedback clock signal FB_CLK and the reference clock signal REF_CLK is large, the toggling cycle of the control clock signal CTRL_CLK becomes shorter, and updates of the delay amount of the second delayed clock signal DLL_CLK is performed relatively earlier.

Figure 6:
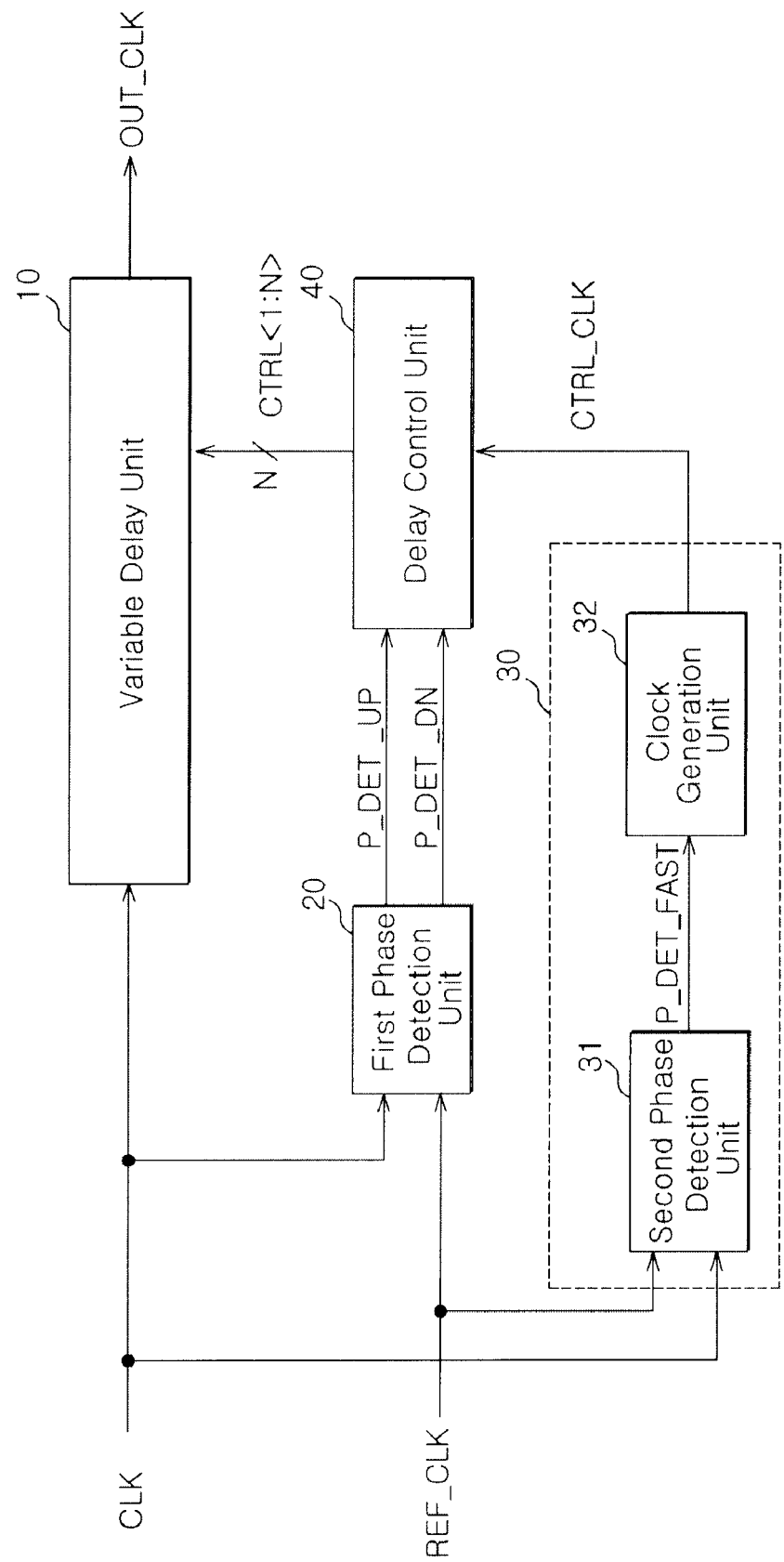
FIG. 6 is an example diagram of a clock signal delay circuit in accordance with a fourth embodiment of the present invention.

FIG. 6 is an example diagram of a clock signal delay circuit in accordance with a fourth embodiment of the present invention. The clock signal delay circuit includes a variable delay unit 10, a first phase detection unit 20, a control clock output block 30, and a delay control unit 40.

Operations of the clock signal delay circuit configured as mentioned above are described below.

The variable delay unit 10 is configured to control the delay amount of an input clock signal CLK based on a delay control signal CTRL<1:N>, and to output a delayed clock signal OUT_CLK based thereon.

The first phase detection unit 20 is configured to output first phase detection signals P_DET_UP and P_DET_DN which have values corresponding to phase differences between the input clock signal CLK and a reference clock signal REF_CLK. The first phase detection signals P_DET_UP and P_DET_DN can be signals that have voltage levels corresponding to phase differences between the input clock signal CLK and the reference clock signal REF_CLK. Alternatively, or in addition to, the first phase detection signals P_DET_UP and P_DET_DN can be signals that have pulse widths corresponding to phase differences between the input clock signal CLK and the reference clock signal REF_CLK. Further, the first phase detection signals P_DET_UP and P_DET_DN can be multi-bit code values. The first phase detection signals P_DET_UP and P_DET_DN are used to generate the delay control signal CTRL<1:N> in the delay control unit 40.

The control clock output block 30 is configured to compare the phases of the input clock signal CLK and the reference clock signal REF_CLK and to output a control clock signal CTRL_CLK which is controlled during toggling cycle thereof. The control clock output block 30 includes a second phase detection unit 31 and a clock generation unit 32. The second phase detection unit 31 is configured to output a second phase detection signal P_DET_FAST, which has a value corresponding to the phase difference between the input clock signal CLK and the reference clock signal REF_CLK. The clock generation unit 32 is configured to output the control clock signal CTRL_CLK, which is controlled during the toggling cycle thereof, based on the second phase detection signal P_DET_FAST. The first phase detection unit 20 and the second phase detection unit 31 can be configured as shown in FIG. 3.

The delay control unit 40 is configured to generate the delay control signal CTRL<1:N> based on the first phase detection signals P_DET_UP and P_DET_DN and in response to the control clock signal CTRL_CLK. The delay control unit 40 can include a shift register.

In the clock signal delay circuit disclosed above, the delay control signal CTRL<1:N> is generated using the control clock signal CTRL_CLK, which has a toggling cycle that decreases as the phase difference between the input clock signal CLK and the reference clock signal REF_CLK increases. Accordingly, as the phase difference between the input clock signal CLK and the reference clock signal REF_CLK becomes large, update of the delay amount in the variable delay unit 10 is performed earlier. As such, in the example where the delay control unit 40 includes a shift register, updates of code output from the shift register is performed earlier as the toggling cycle of the control clock signal CTRL_CLK becomes shorter due to the control clock signal CTRL_CLK being used as the operating clock signal of the shift register.

While certain embodiments have been described herein, it will be understood to those skilled in the art that the embodiments described are by way of example only. Accordingly, the clock signal delay circuit described herein should not be limited based on the described embodiments. Rather, the clock signal delay circuit described herein should only be limited in light of the claims that follow when taken in conjunction with the above description and accompanying drawings.

What is claimed is:

1. A clock signal delay circuit comprising:
   a variable delay unit configured to control a delay amount of a reference clock signal based on a delay control signal and to provide a delayed clock signal based thereon;
   a delay unit configured to delay the delayed clock signal and to provide a feedback clock signal based thereon;
   a phase detection block configured to detect a phase difference between the feedback clock signal and the reference clock signal and to provide a detected phase difference based thereon;
   a control clock output block configured to provide a control clock signal, which has a toggling cycle based on the detected phase difference, wherein the control clock output block provides the control clock signal which has a shorter toggling cycle as the phase difference between the feedback clock signal and the reference clock signal becomes larger; and
   a delay control unit configured to generate the delay control signal based on the detected phase difference and in response to the control clock signal.

2. The clock signal delay circuit according to claim 1, wherein the phase detection block comprises:
   a first phase detection unit configured to detect whether the phase difference between the feedback clock signal and the reference clock signal is within a first difference value; and
   a second phase detection unit configured to detect whether the phase difference between the feedback clock signal and the reference clock signal is within a second difference value.

3. The clock signal delay circuit according to claim 2, wherein the first phase detection unit comprises:
- a first delay section configured to delay the feedback clock signal by the first difference value and to provide a first delayed clock signal based thereon;
- a second delay section configured to delay the reference clock signal by the first difference value and to provide a second delayed clock signal based thereon;
- a first comparison section configured to compare the reference clock signal and the first delayed clock signal from the first delay section, and to provide a first comparison result based thereon; and
- a second comparison section configured to compare the feedback clock signal and the second delayed clock signal from the second delay section, and to provide a second comparison result based thereon.

4. The clock signal delay circuit according to claim 3, wherein the second phase detection unit comprises:
- a third delay section configured to delay the feedback clock signal by the second difference value and to provide a third delayed clock signal based thereon;
- a fourth delay section configured to delay the reference clock signal by the second difference value and to provide a fourth delayed clock signal based thereon;
- a third comparison section configured to compare the reference clock signal and the third delayed clock signal from the third delay section, and to provide a third comparison result based thereon;
- a fourth comparison section configured to compare the feedback clock signal and the fourth delayed clock signal from the fourth delay section, and to provide a fourth comparison result based thereon; and
- a signal combining section configured to combine the third comparison signal and the fourth comparison signal, and to provide a phase detection signal based thereon.

5. The clock signal delay circuit according to claim 4, wherein the control clock output block comprises:
- a clock generation unit configured to generate a first control clock signal and a second control clock signal having a toggling cycle shorter than the first control clock signal; and
- a clock selection unit configured to selectively provide one of the first control clock signal and the second control clock signal in response to the phase detection signal.

6. The clock signal delay circuit according to claim 4, wherein the control clock output block comprises:
- a clock dividing unit configured to divide the reference clock signal and to provide a first control clock signal and a second control clock signal having a toggling cycle shorter than the first control clock signal; and
- a clock selection unit configured to selectively provide one of the first control clock signal and the second control clock signal in response to the phase detection signal.

7. The clock signal delay circuit according to claim 5, wherein the delay control unit provides the delay control signal based on detected phase difference and in response to the control clock signal from the control clock output block.

8. A clock signal delay circuit comprising:
- a variable delay unit configured to control a delay amount of an input clock signal based on a delay control signal and to provide a delayed clock signal based thereon;
- a first phase detection unit configured to provide a first phase detection signal having a value corresponding to a phase difference between the input clock signal and a reference clock signal;
- a control clock output block configured to compare phases of the input clock signal and the reference clock signal and to provide a control clock signal, which has a toggling cycle based thereon, wherein the control clock output block provides the control clock signal which has a shorter toggling cycle as the phase difference between the input clock signal and the reference clock signal becomes larger; and
- a delay control unit configured to generate the delay control signal based on the first phase detection signal and in response to the control clock signal.

9. The clock signal delay circuit according to claim 8, wherein the first phase detection unit detects whether the phase difference between the input clock signal and the reference clock signal is within a first difference value.

10. The clock signal delay circuit according to claim 9, wherein the control clock output block comprises:
- a second phase detection unit configured to detect whether the phase difference between the input clock signal and the reference clock signal is within a second difference value, and to provide a second phase detection signal based thereon; and
- a clock generation unit configured to selectively provide, in response to the second phase detection signal, one of a first control clock signal and a second control clock signal, wherein the second control clock signal has a toggling cycle shorter than the first control clock signal.

11. The clock signal delay circuit according to claim 10, wherein the first phase detection unit comprises:
- a first delay section configured to delay the reference clock signal by the first difference value and to provide a first delayed clock signal based thereon;
- a second delay section configured to delay the input clock signal by the first difference value and to provide a second delayed clock signal based thereon;
- a first comparison section configured to compare the input clock signal and the first delayed clock signal, and to provide a first comparison result based thereon; and
- a second comparison section configured to compare the reference clock signal and the second delayed clock signal, and to provide a second comparison result based thereon.

12. The clock signal delay circuit according to claim 11, wherein the second phase detection unit comprises:
- a third delay section configured to delay the reference clock signal by the second difference value and to provide a third delayed clock signal based thereon;
- a fourth delay section configured to delay the input clock signal by the second difference value and to provide a fourth delayed clock signal based thereon;
- a third comparison section configured to compare the input clock signal and the third delayed clock signal and to provide a third comparison signal based thereon;
- a fourth comparison section configured to compare the reference clock signal and the fourth delayed clock signal and to provide a fourth comparison signal based thereon; and
- a signal combining section configured to combine the third comparison signal and fourth comparison signal, and to provide a second phase detection signal based thereon.

* * * * *